United States Patent [19]

Burward-Hoy

[11] Patent Number: 5,697,434

[45] Date of Patent: Dec. 16, 1997

[54] DEVICE HAVING A REDUCED PARASITIC THERMAL LOAD FOR TERMINATING THERMAL CONDUIT

[75] Inventor: Trevor Burward-Hoy, Cupertino, Calif.

[73] Assignee: Sun Microsystems, Inc., Mountain View, Calif.

[21] Appl. No.: 531,016

[22] Filed: Sep. 20, 1995

[51] Int. Cl.$^6$ .................................................. F28F 7/00
[52] U.S. Cl. .......................... 165/185; 62/54.2; 62/383; 285/354; 257/716
[58] Field of Search ................. 165/185; 62/467, 62/383, 54.2; 285/353, 354; 257/716

[56] References Cited

U.S. PATENT DOCUMENTS

| | | | |
|---|---|---|---|
| 3,135,537 | 6/1964 | Scott | 285/353 X |
| 3,253,423 | 5/1966 | Sonnabend | 165/185 |
| 3,451,641 | 6/1969 | Leventhal | 62/383 |
| 3,894,911 | 7/1975 | Cooke-Yarborough | 165/185 X |
| 4,182,379 | 1/1980 | Lestak et al. | 165/185 X |
| 4,507,941 | 4/1985 | Lester et al. | 62/54.2 |
| 4,927,192 | 5/1990 | Ungchurshi et al. | 285/353 X |
| 5,099,311 | 3/1992 | Bonde et al. | 257/716 X |
| 5,224,030 | 6/1993 | Banks et al. | 165/185 X |
| 5,350,200 | 9/1994 | Peterson et al. | 285/353 X |

FOREIGN PATENT DOCUMENTS

| | | | |
|---|---|---|---|
| 7113295 | 7/1982 | Japan | 257/716 |
| 8098991 | 6/1983 | Japan | 257/716 |
| 1218076 | 8/1989 | Japan | 257/716 |

*Primary Examiner*—John Rivell
*Assistant Examiner*—Christopher Atkinson
*Attorney, Agent, or Firm*—Blakely Sokoloff Taylor & Zafman

[57] ABSTRACT

A device for receiving thermal conduit comprising a thermally conductive material for coupling between an end of a conducting element of the thermal conduit and an end of an outer shell of the thermal conduit. The thermally conductive material is arranged to physically define a best thermal path from the end of the conducting element to the end of the outer shell such that substantially all thermal energy dissipated from the conducting element to the outer shell flows along the best thermal path. The length of the best thermal path is significantly greater than a nearest distance between the conducting element and the outer shell, and the conductive material is thin and manufactured of a poor thermal conductor such that the total energy dissipated along the best thermal path is reduced.

29 Claims, 5 Drawing Sheets

DEVICE HAVING A REDUCED PARASITIC THERMAL LOAD FOR TERMINATING THERMAL CONDUIT

FIELD OF THE INVENTION

The present invention relates generally to thermal energy delivery systems and more particularly to a device having a reduced parasitic thermal load for terminating thermal conduit.

BACKGROUND OF THE INVENTION

According to the prior art, a cryogenic cooling system may be used to reduce the operating temperature of an integrated circuit (IC) to a sub-ambient temperature. Typically, the thermal energy delivered by a cryogenic cooler is provided over some distance using thermal conduit. The manner in which the thermal conduit is connected to the cryogenic cooler and the IC can result in parasitic thermal loads that reduce the efficiency of the cryogenic cooling system. Therefore, it is desirable to provide a connecting apparatus having a reduced parasitic thermal load in order to increase the efficiency of the cryogenic cooling system.

SUMMARY OF THE INVENTION

A device for receiving or terminating thermal conduit comprising a thermally conductive material for coupling between an end of a conducting element of the thermal conduit and an end of an outer shell of the thermal conduit is described. The thermally conductive material is arranged to physically define a best thermal path from the end of the conducting element to the end of the outer shell that is significantly greater than a nearest distance between the conducting element and the outer shell such that substantially all thermal energy dissipated by the conducting element to the outer shell flows along the best thermal path.

According to one embodiment, the thermally conductive material is stainless steel that is arranged as thin nested cylinders that are coaxial with the conducting element of the thermal conduit. Stainless steel is a poor thermal conductor, but it is a better thermal conductor than air (the ambient). Different thermally conductive materials may be selected in view of different ambient environments. The thin material presents a small cross-sectional area, and the thermal path is greater than the sum of the length of the cylinders such that a long thermal path is achieved. The combination of reduced cross-sectional area, reduced thermal conductivity, and increased thermal path length results in low power (heat) dissipation along the thermal path.

The device may be used to hermetically terminate thermal conduit such that the volume between the conducting element and the outer shell of the thermal conduit may be evacuated for better thermal isolation of the conducting element. Receiving devices manufactured of an insulating material may be interspersed throughout the interior of a segment of thermal conduit to allow flexure of the segment and to better ensure that the conducting element does not directly contact the outer shell, which would effectively couple the conducting element to the ambient.

According to one embodiment, a connector is provided that uses two such terminating devices for terminating two conduit segments wherein the devices leave faces of the two conducting elements exposed. Attaching the two conduit segments using the connector results in the faces of the two conducting elements being compressively coupled to one another for good thermal contact.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
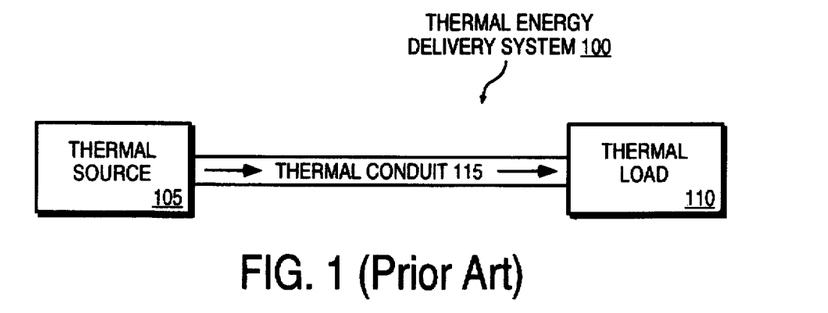
FIG. 1 shows a thermal energy delivery system.

FIG. 1 shows a thermal energy delivery system 100 that comprises a thermal source 105 and a thermal load 110 connected via thermal conduit 115, which delivers thermal energy from thermal source 105 to thermal load 110. According to one embodiment, thermal source 105 comprises a cryogenic cooling system, and thermal load 110 comprises an integrated circuit.

Figure 2:
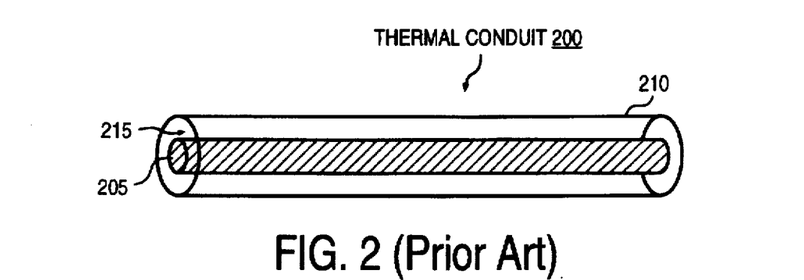
FIG. 2 shows thermal conduit according to the prior art.

FIG. 2 shows thermal conduit 115 as generally comprising a center conducting element 205 that is surrounded by an annular volume 215 contained within an outer cylindrical shell 210. Conducting element 205 may comprise any appropriate device such as solid copper or a heat pipe. Wherein annular volume 215 may be filled with insulating material, it is preferable to evacuate annular volume 215 for improved isolation of thermal conducting element 205 from cylindrical shell 210 and the ambient atmosphere.

Figure 3:
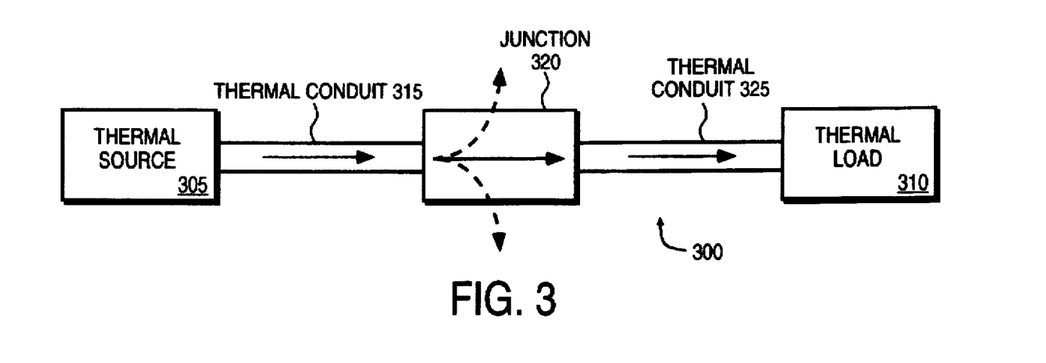
FIG. 3 shows a thermal energy delivery system wherein two thermal conduit segments are connected via a conduit connector.

The thermal energy delivery system of FIG. 1 assumes that the thermal source and the thermal load are fixedly attached to the thermal conduit. It is desirable, however, to allow the thermal source to be coupled to and decoupled from the thermal load in a convenient manner. Therefore, FIG. 3 shows a thermal energy delivery system 300 that includes a connector 320 that operates according to a present embodiment. Connector 320 connects two segments of thermal conduit 315 and 325 to one another by compressively coupling the ends of the thermal conducting elements of the conduit segments to one another. Connector 320 may be alternatively provided to connect a single segment of thermal conduit to the thermal load or the thermal source.

As a practical matter, thermal conduit is not manufactured of a perfect thermal conductor, and some thermal energy is expended when delivering thermal energy to the thermal load via the thermal conduit. Thus, the thermal conduit presents a parasitic load to the thermal source due to the non-zero thermal impedance of the thermal conduit. Connector 320 similarly presents a parasitic thermal load because good thermal contact between different segments of thermal conduit requires physical contact between the conducting elements of the conduit segments. Providing such contact typically entails the exposure of the conducting elements to the ambient environment, which leads to reduced thermal isolation of the conducting elements at the point of contact. Reduced thermal isolation results in thermal energy escaping to the ambient, as indicated by dashed arrows of FIG. 3. Wherein the parasitic thermal load of thermal conduit must always be accounted for, it is desirable to minimize the parasitic thermal loads of connectors such as connector 320.

The amount of thermal power dissipated by connector 320 at the point of contact, and thus the parasitic thermal load presented by connector 320, is generally described by the following equation:

$$Q = \frac{C_v \cdot A \cdot dT}{l},$$

wherein Q is the power dissipated along the thermal path, $C_v$ is the thermal conductivity of the thermal path, A is the cross-sectional area of the thermal path, dT is the temperature differential between the thermal conductor and the ambient, and l is the length of the thermal path. Assuming that the desired temperature differential is fixed, the dissipated power at the point of contact may be reduced by decreasing the thermal conductivity and cross-sectional area of the thermal path while simultaneously increasing the length of the thermal path.

According to the present embodiments the parasitic thermal load presented by connector 320 is reduced by physically defining the thermal paths from the conducting elements to the ambient at the area of contact between the conduit segments. According to a first embodiment wherein the volume at the point of contact is not evacuated, each conduit segment is terminated using an hermetic, thermally conducting material that is a better thermal conductor than air, but is otherwise a poor thermal conductor. The use of an hermetic material allows the vacuum of the annular volume to be maintained for each conduit segment, while the higher thermal conductivity of the terminating material encourages thermal energy to be dissipated along the path defined by terminating material. Additionally, the terminating material is thin to provide a reduced cross-sectional area and is formed in such a manner as to provide a thermal path from the conducting element of a conduit segment to the outer shell of the conduit segment that is longer than the radial distance from the conducting element to the outer shell.

According to a second alternative embodiment the volume surrounding the point of contact is in communication with the annular volumes of the conduit segments such that the volume surrounding the point of contact may be evacuated after the connection between the conduit segments has been made. The terminating material of the second alternative embodiment is perforated and may be a thermally insulating material.

Figure 4A:
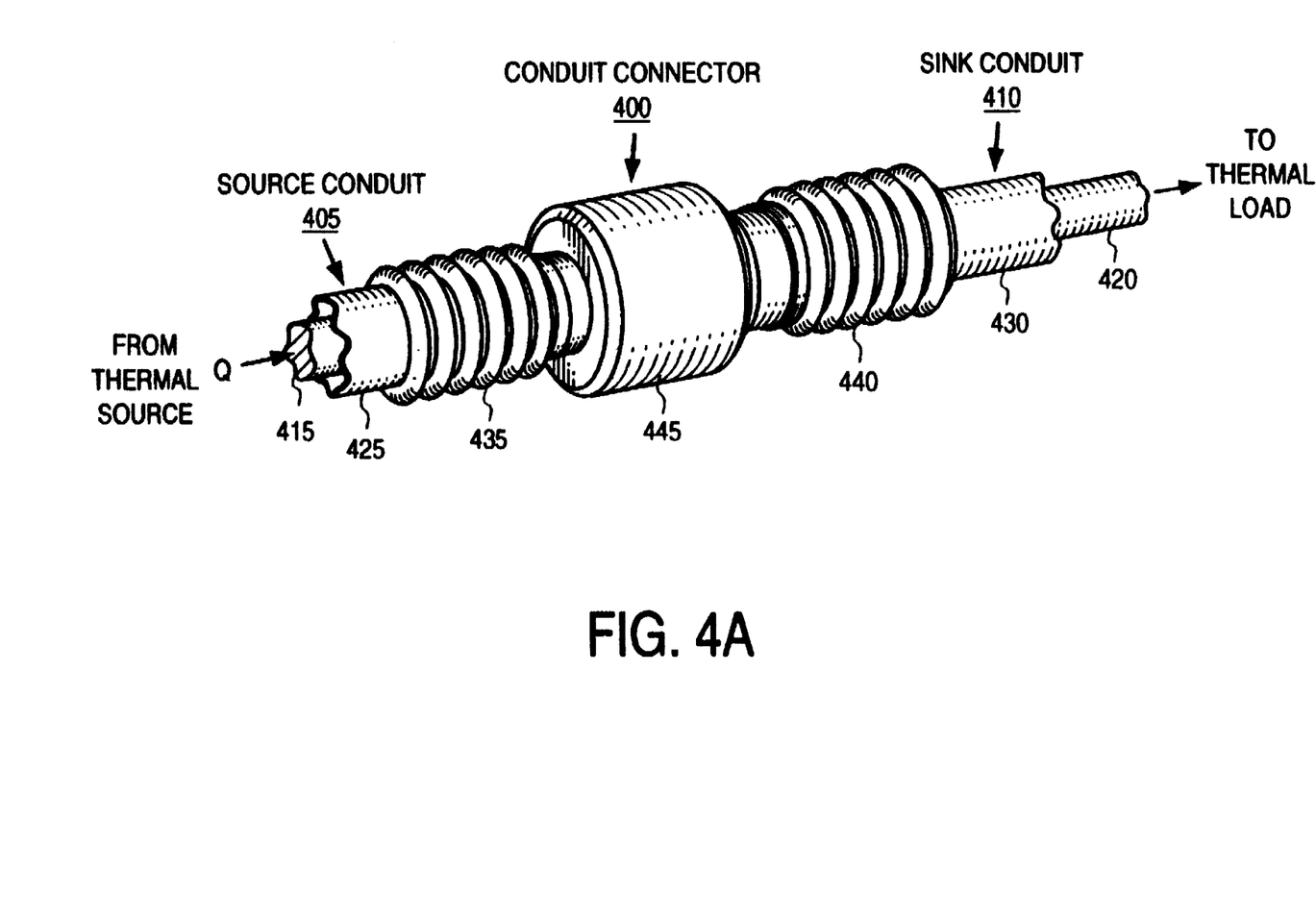
FIGS. 4A-4D show a conduit connector according to embodiments of the present invention.

FIG. 4A shows an outer view of a conduit connector 400 according to one embodiment. Source conduit segment 405 is attached to a thermal source (such as shown in FIG. 2), and sink conduit segment 410 is coupled to a thermal load (such as shown in FIG. 2). Both conduit segments are terminated as described in more detail below. Attaching nut 445 connects the terminated conduit segments and provides an hermetic seal of the volume surrounding the area of contact between the conducting elements. Bellows segments 435 and 440 are connected at both ends of the attaching nut 445 and between the outer shells 425 and 430 of the source and sink conduit segments, respectively, to provide flexibility at the connection point.

Figure 4B:
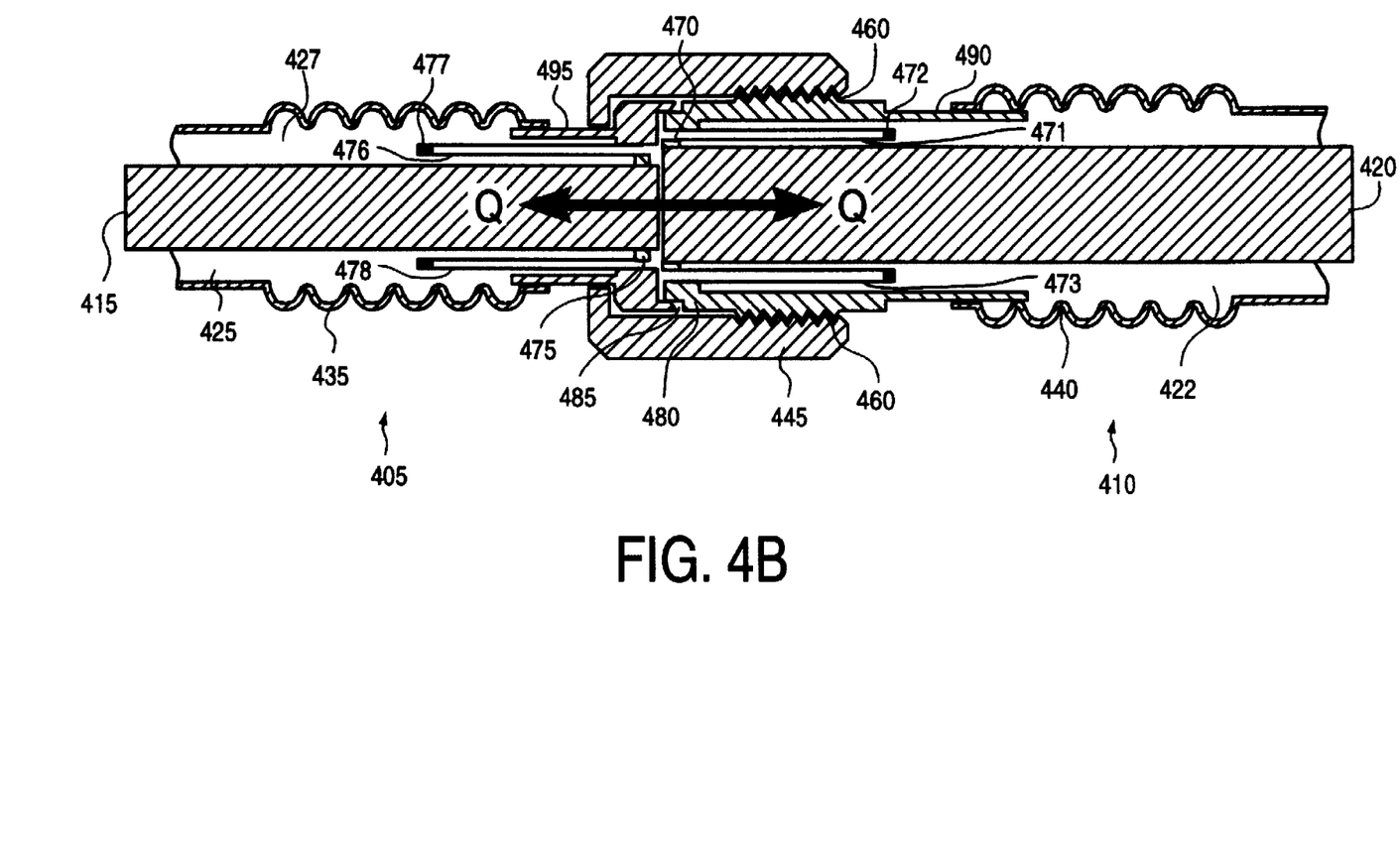

FIG. 4B is a cross-sectional side view of conduit connector 400. As shown, attaching nut 445 is attached to the end of sink conduit segment 410 for receiving threads 460, which are attached to the end of source conduit segment 405. When attaching nut 445 is tightened over threads 460 heat conducting elements 415 and 420 are compressively coupled to one another for good thermal contact.

Sink conduit segment 410 is terminated by terminator 490, which acts to define a relatively long thermal path from the thermal conducting element 420 to the ambient environment. Similarly, terminator 495 defines a relatively long thermal path from thermal conducting element 415 to the ambient. Terminators 490 and 495 also support the heat conducting elements to maintain a minimum distance between the conducting elements and the outer shells.

Terminator 490 generally comprises attaching ring 470 which is coupled to receive thermal conducting element 420. Attaching ring 470 provides a terminus of a first inner cylinder 471 of low conductivity material that extends towards the remainder of thermal conducting element 420. Spacing ring 472 receives the inner cylinder and provides a small differential in thickness for a second outer cylinder 473 that extends back towards the end of thermal conducting element 420. Thus, there is a space between the first and second cylinders. The second cylinder 473 is shown as being connected to an outer shell of terminator 490 wherein threads 460 are provided. The outer shell is coupled to bellows 440. The end of the outer shell forms a face having a groove 480. It is clearly evident that multiple inner and outer cylinders may be implemented to provide further thermal isolation.

Terminator 495 similarly includes attaching ring 475 for receiving the end of heat conducting element 415 of source conduit segment 405. A first inner cylinder extends 476 back towards the remainder of thermal conducting element 415 to be received by spacing ring 477. A second cylinder 478 of greater radius has one end attached to second ring 477 and extends back towards the end of heat conducting element 415. The other end of the second outer cylinder 478 is attached to an outer shell of terminator 495. The end of the outer shell forms a face having a lip 485.

Attaching nut 445 is rotatably coupled to the outer shell of terminator 495. When the attaching nut 445 is tightened over threads 460, lip 485 is received by groove 480, the face 465 of thermal conducting element 415 is compressively coupled to the face 466 of thermal conducting element 420, and the volume between the inner and outer cylinders of terminators 490 and 495 is hermetically sealed. This volume may also be evacuated to provide improved thermal isolation.

According to a first embodiment, the first and second cylinders of terminators 490 and 495 are manufactured of a poor thermal conductor, such as stainless steel which has a thermal conductivity of approximately 20 kw/$_{m°c}$, and the cylinders are as thin as possible without unduly sacrificing rigidity of the terminators. For example, when the cylinders are manufactured of stainless steel, the cylinders may be 0.005 inches thick. Nesting the cylinders in the manner shown in FIG. 4B results in a long thermal path through a poor thermal conductor having a small cross-sectional area such that thermal isolation between the thermal conducting elements and the ambient is increased. The thermal path may be lengthened by including additional nested cylinders. Arrangements other than nested cylinders can yield similar results.

Figure 4C:
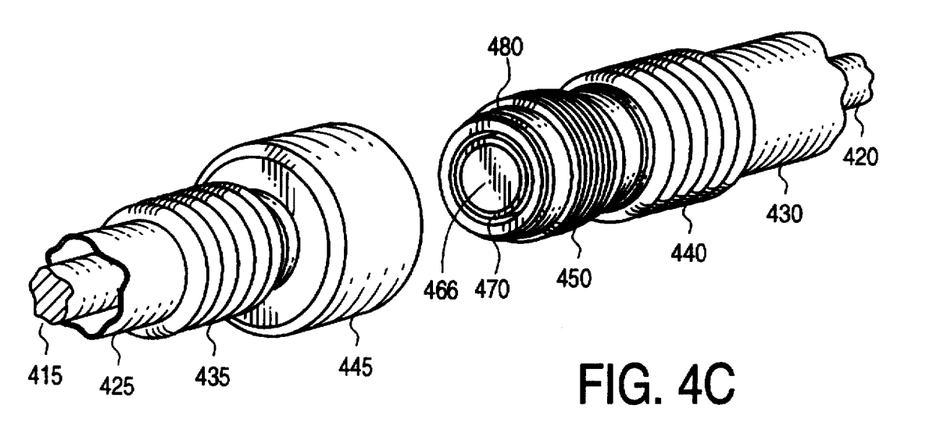
Figure 4D:
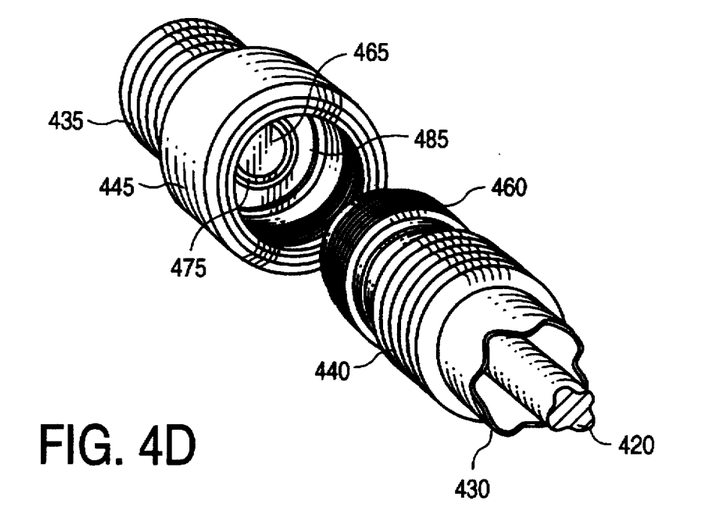

According to an alternative embodiment, terminators 490 and 495 may be perforated to allow communication between the annular volumes of the thermal conduit segments. The annular volumes of the conduit segments and the volume surrounding the point of contact may be evacuated after being connected via conduit connector 420. The material of the cylinders of the terminator may therefore be manufactured of a plastic or other non-hermetic low conductivity material, so long as tightening the attaching nut 445 over threads 450 results in a hermetic seal. FIG. 4C is perspective drawing showing the terminator 490 in more detail. FIG. 4D similarly shows a perspective of terminator 495.

Wherein the attaching rings, spacing rings, and inner and outer cylinders have been described as if each is a separate component, the rings and cylinders may be integrally formed from a single piece of material. Alternatively, the attaching rings may be manufactured of the same material as the conducting elements, or the conducting elements may be flanged at their ends to provide an attachment point for the inner cylinders, which obviates the need for attaching rings. Manufacturing the "attaching rings" of the same material as the conducting elements reduces concerns of matching coefficients of thermal expansion. The thinness of the inner and outer cylinders provides flexibility which allows for some mismatch in coefficients of thermal expansion as between the materials of the conducting elements and the terminating devices.

Wherein each conduit segment has been described as having its own terminator and each terminator includes cylinders that extend back towards the remainder of the conduit segment, a single terminator may be provided that extends outwards from the conduit segment. The other conduit segment may then simply include an attachment device that merely receives the terminator and provides an hermetic seal. Such a simplified arrangement is especially useful when the terminator is perforated and the inner volumes of the conduit segments are evacuated after attachment.

Finally, wherein the devices described herein have been described as terminating devices, the devices may also be provided throughout the length of a conduit segment to provide flexure of the segment and to better ensure that the conducting element of the conduit segment does not contact the outer shell. Such receiving devices may be manufactured of an insulating material and should be perforated to allow evacuation of the inner volume of the conduit segment.

Figure 5:
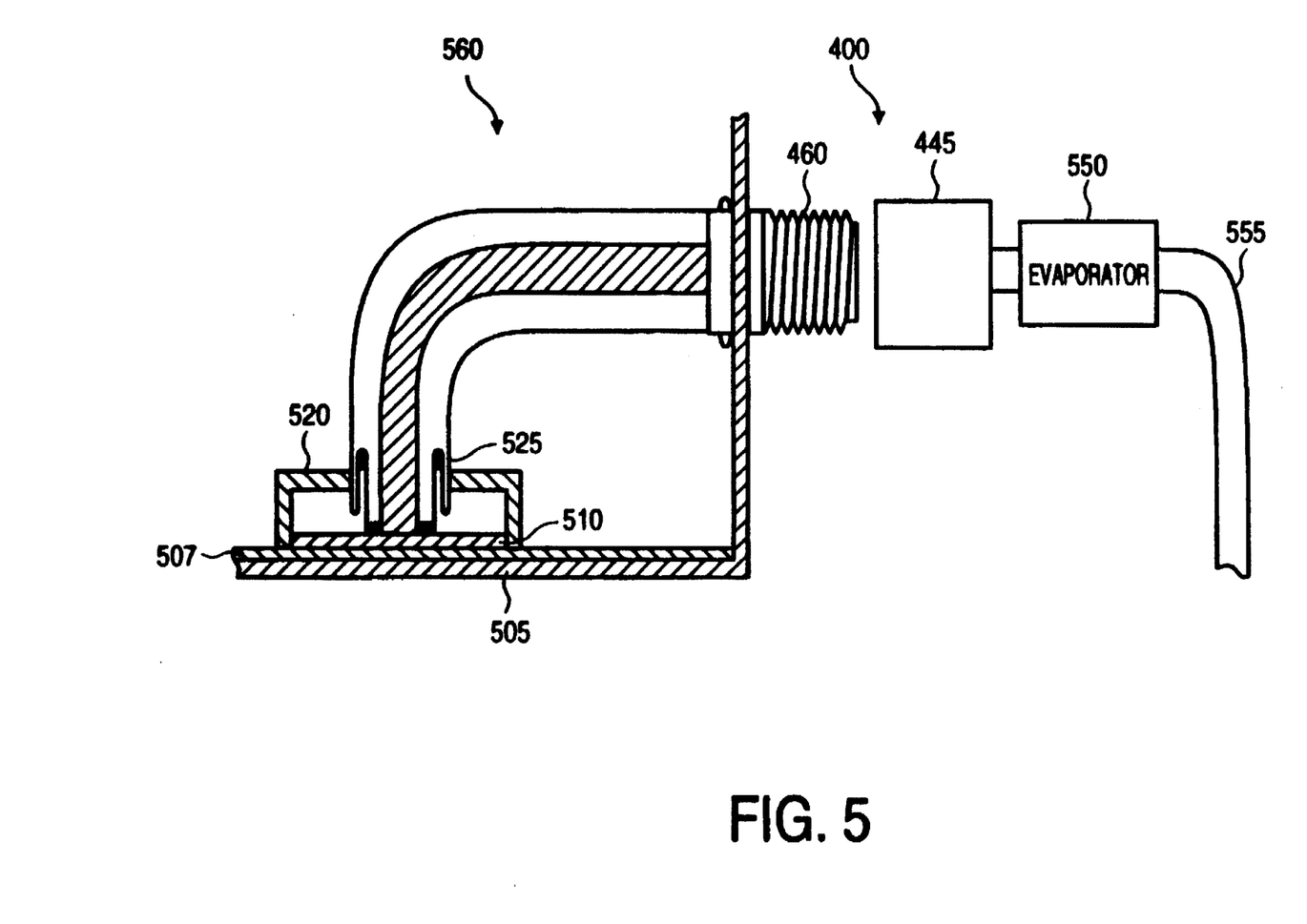
FIG. 5 shows a thermal energy delivery system wherein the conduit connector of FIGS. 4A-4D is used.

FIG. 5 shows a system that uses the novel terminating and connecting technology described above. Housing 505 of a computer system that includes printed circuit board 507 and integrated circuit (IC) chip 510 has a sidewall to which one end of conduit connector 400 is fixedly attached. Sink conduit segment 560 is terminated at the sidewall of housing 505 by terminators 490 (as shown in FIGS. 4A–4D) and at the point of contact to IC chip 510 by terminator 525. Support member 520 provides an aperture that receives sink conduit segment. Support member 520 preferably surrounds the entirety of IC chip 510 so that the volume surrounding the point of contact between sink conduit segment 560 and IC chip 510 may be hermetically sealed. Support member 520 may be manufactured of a poor thermal conductor that is also an hermetic material, e.g. stainless steel.

Source conduit segment 555 is coupled to a cryogenic cooler (not shown) and is terminated by terminator 495 (as shown in FIGS. 4A–4D) and attaching nut 445. Evaporator 550 is shown as being attached to source conduit segment 555 and operates as is well known in the art. By tightening attaching nut 445 over threads 460, the conducting elements of the sink and source segments are thermally coupled such that IC chip 510 may be cryogenically cooled.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A device for receiving a thermal conduit including a conducting element and an outer shell, comprising:
   a thermally conductive material for coupling between an end of the conducting element and an end of the outer shell of the thermal conduit, the thermally conductive material being arranged to physically define a thermal path from the end of the conducting element to the end of the outer shell such that substantially all thermal energy dissipated from the conducting element to the outer shell flows along the thermal path, the thermally conductive material including
   an attaching ring coupled to the end of the conducting element,
   a first cylinder having a first end coupled to the attaching ring,
   a spacing ring coupled at a second end of the first cylinder, and
   a second cylinder coupled between the attaching ring and the outer shell of the thermal conduit, the second cylinder extending from the spacing ring towards the first end of the first cylinder.

2. The device as claimed in claim 1, wherein the thermally conductive material provides an hermetic seal such that a volume between the conducting element and the outer shell of the thermal conduit may be evacuated.

3. The device as claimed in claim 1, wherein the thermally conductive material has low thermal conductivity.

4. The device as claimed in claim 3, wherein the thermally conductive material is stainless steel.

5. A thermally conductive device for receiving a thermal conduit having a conducting element and an outer shell, the thermally conductive device comprising:
   an attaching ring coupled to an end of the conducting element;
   a first cylinder having a first end coupled to the attaching ring;
   a spacing ring coupled at a second end of the first cylinder; and
   a second cylinder coupled between the attaching ring and the outer shell of the thermal conduit, the second cylinder extending from the spacing ring towards the first end of the first cylinder.

6. The thermally conductive device as claimed in claim 5, wherein the attaching ring is manufactured of a same material as the conducting element.

7. The thermally conductive device as claimed in claim 5, wherein the first and second cylinders are manufactured of a poor thermal conductor.

8. The thermally conductive device as claimed in claim 7, wherein the poor thermal conductor is stainless steel.

9. The thermally conductive device as claimed in claim 5 being manufactured of hermetic materials such that an annular volume between the conducting element and the outer shell of the thermal conduit may be evacuated.

10. A thermal conduit for delivering thermal energy, comprising:
   a conducting element having an end;
   an outer shell substantially surrounding the conducting element, the outer shell having an end; and
   a terminating device that receives the conducting element such that a face of the conducting element is exposed, the terminating device comprising a thermally conductive material coupled between the end of the conducting element and the end of the outer shell, the thermally conductive material, including at least an interconnection of an attaching ring, a first cylinder, a spacing ring and a second cylinder, being arranged to physically define a thermal path from the end of the conducting element to the end of the outer shell such that substantially all thermal energy dissipated from the conducting element to the outer shell flows along the thermal path.

11. The thermal conduit as claimed in claim 10, wherein the thermally conductive material provides an hermetic seal such that a volume between the conducting element and the outer shell of the thermal conduit may be evacuated.

12. The thermal conduit as claimed in claim 10, wherein the thermally conductive material has low thermal conductivity.

13. The thermal conduit as claimed in claim 12, wherein the thermally conductive material of the terminating device is stainless steel.

14. A thermal conduit for delivering thermal energy, comprising:
   a conducting element having an end;
   an outer shell substantially surrounding the conducting element, the outer shell having an end; and
   a terminating device that receives the conducting element such that a face of the conducting element is exposed, the terminating device comprising a thermally conductive material coupled between the end of the conducting element and the end of the outer shell, the thermally conductive material including
     an attaching ring coupled to the end of the conducting element,
     a first cylinder having a first end coupled to the attaching ring, the first cylinder extending from the end of the conducting element towards a remainder of the conducting element,
     a spacing ring coupled at a second end of the first cylinder, and
     a second cylinder coupled between the attaching ring and the end of the outer shell of the thermal conduit, the second cylinder extending from the spacing ring towards the end of the conducting element.

15. The thermal conduit as claimed in claim 14, wherein the attaching ring is manufactured of a same material as the conducting element.

16. The thermal conduit as claimed in claim 14, wherein the first and second cylinders are manufactured of a poor thermal conductor.

17. The thermal conduit as claimed in claim 16, wherein the poor thermal conductor is stainless steel.

18. The thermal conduit as claimed in claim 14, wherein the terminating device is manufactured of hermetic materials such that an annular volume between the conducting element and the outer shell may be evacuated.

19. A connector for coupling a first segment of a thermal conduit including a first conducting element and a first outer shell to a second segment of the thermal conduit including a second conducting element and a second outer shell, the connector comprising:
   a first apparatus that receives the first segment of thermal conduit having a face of the first conducting element exposed, the first apparatus including
     a first terminating device including a thermally conductive material for coupling between an end of the first conducting element and an end of the first outer shell, the thermally conductive material being arranged to physically define a first thermal path from the end of the first conducting element to the end of the first outer shell such that substantially all thermal energy dissipated from the first conducting element to the first outer shell flows along the first thermal path, and
     an attaching nut coupled to the first terminating device; and
   a second apparatus that receives the second segment of thermal conduit having a face of the second conducting element exposed, the second apparatus comprising:
     a second terminating device including a thermally conductive material for coupling between an end of the second conducting element and an end of the second outer shell, the thermally conductive material being arranged to physically define a second thermal path from the end of the second conducting element to the end of the second outer shell such that substantially all thermal energy dissipated from the second conducting element to the second outer shell flows along the second thermal path, and
   threads coupled to the second terminating device, the threads being received by the attaching nut in a manner that compressively couples the face of the first conducting element to the face of the second conducing element so that thermal energy flows freely between the first and second conducting elements.

20. The connector as claimed in claim 19, wherein the thermally conductive material of the first and second terminating devices provides an hermetic seal such that volumes between the conducting elements and the outer shells of the first and second segments of the thermal conduit may be evacuated.

21. The connector as claimed in claim 19, wherein the thermally conductive material of the first and second terminating devices has low thermal conductivity.

22. The connector as claimed in claim 21, wherein the thermally conductive material of the first and second terminating devices is stainless steel.

23. The connector as claimed in claim 19, wherein the thermally conductive material of the first terminating device comprises:
   an attaching ring coupled to the end of the first conducting element;
   a first cylinder having a first end coupled to the attaching ring;
   a spacing ring coupled at a second end of the first cylinder; and
   a second cylinder coupled between the attaching ring and the first outer shell, the second cylinder extending from the spacing ring towards the first end of the first cylinder.

24. The connector as claimed in claim 23, wherein the attaching ring is manufactured of a same material as the first conducting element.

25. The connector as claimed in claim 23, wherein the first and second cylinders are manufactured of a poor thermal conductor.

26. The connector as claimed in claim 25, wherein the poor thermal conductor is stainless steel.

27. A thermal energy delivery system comprising:
   a thermal source;
   a thermal load; and
   a thermal conduit connected to the thermal source of the thermal load, the thermal conduit including
     a conducting element having an end,
     an outer shell that substantially surrounds the conducting element, the outer shell having an end, and
     a terminating device that receives the conducting element, the terminating device including a thermally conductive material coupled between the end of the conducting element and the end of the outer shell, the thermally conductive material being arranged to define a thermal path from the end of the conducting element to the end of the outer shell so that substantially all thermal energy flows along the thermal path.

28. The thermal energy delivery system conduit as claimed in claim 27, wherein the thermally conductive material of the terminating device further comprising:

- an attaching ring coupled to the end of the conducting element;
- a first cylinder having a first end coupled to the attaching ring;
- a spacing ring coupled at a second end of the first cylinder; and
- a second cylinder coupled between the attaching ring and the end of the outer shell, the second cylinder extending from the spacing ring towards the first end of the first cylinder.

29. A thermal energy delivery system comprising:

a thermal source;

a thermal load; and a thermal conduit connected to the thermal source of the thermal load, the thermal conduit including a conducting element having an end, an outer shell that surrounds the conducting element to form a volume between the outer shell and the conducting element, the outer shell having an end, and a terminating device that receives the conducting element, the terminating device including a thermally conductive material including an attaching ring coupled to a first end of the conducting element, a first cylinder coupled to the attaching ring, a spacing ring coupled at a second end of the first cylinder, and a second cylinder coupled between the attaching ring and the outer shell, the second cylinder extending from the spacing ring towards the first end of the first cylinder.

* * * * *